United States Patent [19]

Yamada et al.

[11] 4,443,531

[45] Apr. 17, 1984

[54] DELETING AGENTS FOR PRINTING PLATES AND METHOD FOR DELETION

[75] Inventors: Shoji Yamada; Eiji Kanada; Eiji Mathubara, all of Nagaokakyo, Japan

[73] Assignee: Mitsubishi Paper Mills, Ltd., Tokyo, Japan

[21] Appl. No.: 424,300

[22] Filed: Sep. 27, 1982

[30] Foreign Application Priority Data

Dec. 18, 1981 [JP] Japan .................................. 56-203595
Jul. 8, 1982 [JP] Japan .................................. 57-119026

[51] Int. Cl.³ .............................................. G03F 7/00
[52] U.S. Cl. ..................................... 430/204; 430/205; 430/309; 430/331
[58] Field of Search ............... 430/302, 309, 204, 205, 430/248; 134/38; 544/211, 213, 216

[56] References Cited

U.S. PATENT DOCUMENTS

| | | | |
|---|---|---|---|
| 2,375,733 | 5/1945 | Kaiser | 544/213 |
| 2,476,536 | 7/1949 | Dersch | 544/213 |
| 2,676,150 | 4/1954 | Loughran et al. | 544/211 |
| 2,996,505 | 8/1961 | Schwarze | 544/213 |
| 3,017,270 | 1/1962 | Tregillus et al. | 430/248 |
| 3,778,368 | 12/1973 | Nakamura et al. | 544/213 |
| 4,230,792 | 10/1980 | Tsubai | 430/302 |

*Primary Examiner*—Mary F. Downey

[57] ABSTRACT

Disclosed are a deletion fluid for offset printing plates which contains an S-triazine compound represented by the following general formula:

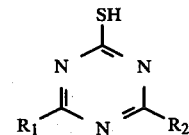

(wherein $R_1$ and $R_2$ represent —SH or —OH and when either one of $R_1$ or $R_2$ is —SH, the other may be NHR wherein R is H or —R′—COOH wherein R′ is an alkylene group or arylene group) and a method for deletion of undesired portion of images formed on an offset printing plate with said deletion fluid.

7 Claims, No Drawings

DELETING AGENTS FOR PRINTING PLATES AND METHOD FOR DELETION

BACKGROUND OF THE INVENTION

This invention relates to an image deleting agent for offset printing plates which use silver images produced on the offset printing plates as ink receptive areas which deletes the ink receptivity of the silver images by rendering hydrophilic the undesired portion of the silver images. More particularly, it relates to removal of ink receptivity of undesired portion of silver images photographically or physically formed on offset printing plates by rendering completely hydrophilic that portion of the silver images without giving any adverse effect on printing characteristics and properties of substrate by treating the surface with a specific treating agents at an optional stage of printing procedure. Usually, such treatment is called "deletion" in the field of printing and so the inventors use this terminology in this specification. The treating agent used for deletion is called "deleting agent".

Generally, portions of printing plate made by photomechanical process which require deletion include those which are already present in originals to be copied, produced at the time of exposure or produced due to uneven developing treatment, etc.

That is, for example, there are cases where the originals contain undesired images or have dusts, dirty powders, finger prints and other stains and furthermore, when laminated originals are used, a shadow may be produced by the exposure. In order to obtain good printed matters, said portions must be deleted at the stages of plate making and printing. Generally, the deletion is an essential treatment and so it is preferred that necessary deletion can be carried out at an optional stages in plate making and printing procedures.

Many proposals have been made for deleting unnecessary images of offset printing plates which use silver images as ink receptive areas. For example, there are the following methods, namely, a method which comprises precipitating a hydrophilic metal salt, rubber, latex, gelatin or other hydrophilic polymer or pigment on the silver image; a method which comprises mechanically removing the silver image by erasers, knives, etc.; a method which comprises removing metallic silver of the image areas by treating it with a bleaching-fixing solution for silver images which contains an oxidant such as a bichromate or ferricyanide and a sulfite or thiosulfate; etc. However, it is difficult according to these methods to completely accomplish the deletion. That is, these methods have the following defects, namely, oleophilic images are exposed again during printing, stains and other problems may occur, the treatment may require much time to reduce working efficiency, stability of the deletion fluid is not sufficient causing reduction of deleting ability during storage. Furthermore, it is actually difficult to detele images after printing has been once started, namely, an ink film has been formed on silver images.

The deleting agent disclosed in Japanese Patent Application "Kokai" (Laid-open) No. 92101/73 which comprises a compound having mercapto or thion group and a hydrophilic group (e.g., hydroxyl group, carboxyl group, sulfonic group, etc.) in the same molecule and which further improved deleting agents disclosed in Japanese Patent Application "Kokai" (Laid-open), No. 21901/76 and No. 53002/79 have considerably solved the conventional defects and can make hydrophilic the silver images by almost instantaneous reaction.

However, although these deleting agents have excellent deleting ability, they still have the following defects, namely, they have bad odor peculiar to mercapto compounds, they are easily oxidized like cystine and are sometimes unstable when used as deletion fluid, they have adverse effects on human bodies because they are used as strongly acidic solutions and thus handleability and operability decrease.

Therefore, development of odorless deleting agents which satisfy the conditions required for deleting agents as mentioned above have been strongly demanded.

SUMMARY OF THE INVENTION

The object of this invention is to provide odorless deleting agents which have no such defects as enumerated above, can rapidly and completely delete the images with causing no re-exposure of once delected portions after printing of many copies and show no reduction of deleting ability after storage for a long time.

DESCRIPTION OF THE INVENTION AND PREFERRED EMBODIMENTS

The above object of this invention has been attained by using a S-triazine compound represented by the following general formula as a deleting agent:

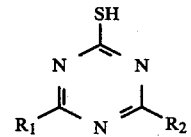

(wherein $R_1$ and $R_2$ represent —SH or —OH and when either one of $R_1$ or $R_2$ is —SH, the other may be NHR wherein R represents H or —R'—COOH wherein R' represents an alkylene group or an arylene group).

The above general formula can also be represented by the following general formulas (I) and (II):

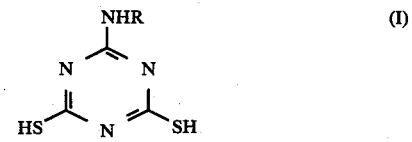

(wherein R represents H or —R'—COOH wherein R' represents an alkylene group or an arylene group):

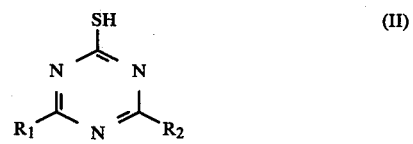

(wherein $R_1$ and $R_2$ represents —SH or —OH).

Representative examples of S-triazine compounds used in this invention are enumerated below, but this invention is never limited to these specific compounds.

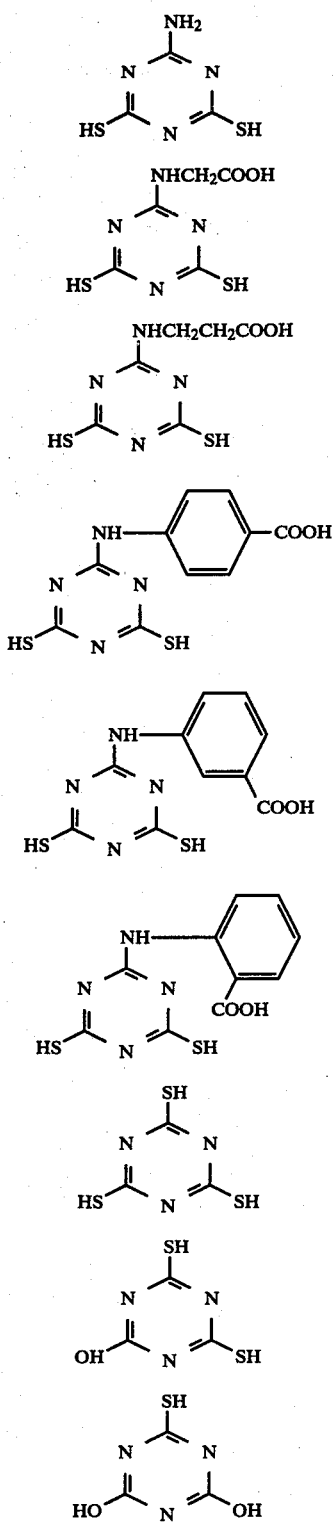

Examples of preparation of these compounds are given below.

PREPARATION EXAMPLE 1

Preparation of Compound (1)

1.65 g of 2-amino-4,6-dichloro-S-triazine obtained by the method disclosed in Chem. Ber. 32 695 (1899) was dissolved in 10 ml of DMF. To the resultant solution kept at 0°-5° C. (internal temperature) by externally cooling it with ice was added 1.6 g of 70% sodium hydrosulfide. After stirring for 3 hours, 10 ml of water was added thereto and this was acidified with addition of 1 N hydrochloric acid. Separated crystal was filtered off and recrystallized from water to obtain 0.27 g of compound (1) which had a melting point of 316° to 318° C. and M+ of 160 at mass spectrum.

PREPARATION EXAMPLE 2

Preparation of Compound (2)

To 10 g of ice water was added 1.84 g of cyanuric chloride dissolved in 50 ml of acetone. To this solution kept at an internal temperature of 0° to 5° C. under stirring were added 1.68 g of sodium bicarbonate and 1.40 g of glycine ethylester hydrochloride and the mixture was stirred at said temperature for 30 minutes. The reaction product was extracted with ethyl acetate and dried with sodium sulfate. Then, ethyl acetate was distilled out and separated crystal was recrystallized from cyclohexane to obtain 1.3 g of 4,6-dichloro-2-ethoxycarbonylmethylamino-S-triazine which had a melting point of 89° to 90.5° C.

1.11 g of thus obtained 4,6-dichloro-2-ethoxycarbonylmethylamino-S-triazine was dissolved in 5 ml of DMF. To the solution was added 0.8 g of 70% sodium hydrosulfide and this was stirred at room temperature for one hour. 5 ml of water was added thereto and this was acidified with 1 N hydrochloric acid. Separated crystal was filtered off, washed with water on a glass filter, then dissolved in 20 ml of 1 N sodium hydroxide to carry out hydrolysis at 120° C. for 10 minutes and then neutralized with 1 N hydrochloric acid. Separated crystal was filtered off and recrystallized from water to obtain 0.62 g of compound (2) which had a melting point of more than 310° C. and M+ of 218 at mass spectrum.

PREPARATION EXAMPLE 3

Preparation of Compound (4)

Compound (4) was obtained in the same method as Preparation Example 2 except that glycine ethylester hydrochloride was replaced with p-ethyl aminobenzoate. This compound had a melting point of more than 320° C. and M+ of 280 at mass spectrum. Compound (3), compound (5), Compound (6) can be obtained in the same method as preparation Example 2.

Preparation and properties of compound (7), (8) and (9) are as explained in detail in E. M. Smolin and L. Rapo port "S-triazines and Derivatives" (pages 105-111) in "The Chemistry of Heterocyclic Compound Series" published from Inter Science Publishers.

The deleting agents of the general formulas (I) and (II) of this invention may be used alone or in combination.

The deleting agents of this invention can be used as deletion fluid using organic solvents, water or mixed solvents thereof. The range of concentration of the deleting agent is 0.1 to 20% by weight which suffices for this invention and preferably 1.0 to 10% by weight.

Furthermore, the deletion fluid of this invention can contain agents for thickening the solution such as carboxymethylcellulose, polyvinyl alcohol, glycerine, etc. and for coloring the solution such as dyes or organic or inorganic pigments, but these are not essential. It can further contain fine powders as disclosed in said Japanese Patent Application "Kokai" (Laid-open) No. 21901/76.

The deleting agent of this invention is non-volatile, stable and odorless. Moreover, it can make rapid and complete deletion and the once deleted portion never receives ink even when the deleted portion is strongly rubbed. Therefore, a great many copies can be printed.

Methods for making offset printing plates which use silver images as ink receptive areas referred to in this invention can be roughly classified as follows:

(1) A method by utilizing the tanning development, in which the imagewise exposed hydrophilic gelatino-silver halide emulsion layer is subjected to tanning development to harden the gelatin of image areas, whereby the image areas are converted into a oleophilic ink-receptive pattern (U.S. Pat. No. 3,146,104).

(2) A method of making a printing plate, in which a metallic silver pattern formed on the exterior surface by the silver diffusion transfer technique is converted into a oleophilic ink-receptive pattern [U.S. Pat. Nos. 3,721,559, 4,160,670 and 3,490,905; Japanese Patent Publication No. 30,562/73; A. Rott and L. Dehaes, Journal of Photographic Science, 8, 26–32 (1960)].

(3) A method for making a lithographic printing plate by utilizing the etching bleach, in which the developed silver image areas or the areas of silver image formed by the transfer development are treated with a bleaching solution and, at the same time, the gelatin in the silver pattern areas is destroyed to expose the oleophilic surface (U.S. Pat. Nos. 3,385,701 and 3,814,603; Japanese Patent Publication No. 27,242/69).

(4) A method in which the undeveloped silver halide image areas in the developed hydrophilic gelatino-silver halide emulsion layer are selectively converted into an oleophilic ink-receptive pattern [U.S. Pat. Nos. 3,454,398, 4,230,772, 3,764,323 and 3,099,209; Japanese Patent Application "Kokai" (Laid-open) No. 9,603/781].

Among these printing plates, the deleting agents of this invention are applied to those obtained by the methods (2) and (4) and especially preferably those obtained by the method (2).

This invention will be further illustrated by the following Examples.

EXAMPLE 1

A polyethylene terephthalate film (100μ) base was undercoated with a known aqueous solution mainly composed of gelatin, nigtrocellulose and para-chlorophenol. Thereon was coated a top coating liquid having the following composition and this was dried to obtain an offset printing plate.

| | |
|---|---|
| 0.2% aqueous silver nitrate solution | 10 cc |
| 1% aqueous potassium bromide solution | 1 cc |
| 2% formalin solution | 10 cc |
| 0.03N sodium hydroxide solution | 100 cc |
| Water to make 200 cc | |

This offset printing plate was brought into contact with negative image of a light sensitive negative sheet produced previously by the known silver complex diffusion transfer process and they were treated with an alkali reducing agent solution (transfer developing solution) to obtain a positive image on the offset printing plate. Deletion fluids were prepared by using the deleting agents as shown in Table 1 in an amount as also shown in Table 1 with which 80 mmol of sodium hydroxide and water were mixed to obtain totally 100 ml of the fluids. The image portions of said offset printing plate to be deleted were wiped with an absorbent cotton impregnated with said deletion fluid.

TABLE 1

| Deletion fluids | Deleting agent | Amount (mmol/100 ml) |
|---|---|---|
| No. 1 | Compound (2) | 40 |
| No. 2 | Comparative Compound (a) | 40 |
| No. 3 | Comparative Compound (b) | 40 |

Comparative compounds (a) and (b) were thioglycolic acid and thiomalic acid, respectively.

These offset printing plates were mounted on a printing machine and then a liquid of the following composition (for making silver image oleophilic) was applied to all over the surface of the printing plates, e.g., by an absorbent cotton impregnated with said liquid.

| | |
|---|---|
| 3-mercapto-4-acetamido-5-n-heptyl-1,2,4-triazole | 3.5 g |
| Isopropanol | 150 ml |
| Water | 250 ml |

Immediately thereafter, printing was started and the portion of the printed copies corresponding to the deleted portion was examined on ink stain to find that ink stain was observed after printing of 2,000 copies in the case of the comparative compound (a) and after printing of 3,000 copies in the case of the comparative compound (b) while no ink stain was observed even after printing of 5,000 copies in the case of compound (2) of this invention. Furthermore, deletion fluids No. 2 and No. 3 had the odor of mercapto while deletion fluid No. 1 of this invention was odorless.

EXAMPLE 2

Lithographic printing plate materials were produced in the same method as in Example 1 of U.S. Pat. No. 4,160,670 except that 1.0 g/m² of hydroquinone was contained in the physical development nuclei layer of the offset printing plate (plate No. 3).

The resultant lithographic printing plate materials were imagewise exposed, then transfer developed by dipping them in a transfer developing solution of the following composition at 30° C. for 30 seconds, thereafter dipped in a stop solution of the following composition for 30 seconds (25° C.), then squeezed to remove excess solution and dried under atmospheric condition to obtain printing plates.

| [Transfer developing solution] | |
|---|---|
| Water | 700 ml |
| Potassium hydroxide | 20 g |
| Anhydrous sodium sulfite | 60 g |
| Potassium bromide | 0.5 g |
| 2-mercaptobenzoic acid | 1 g |
| 3-mercapto-4-acetamido-5-n-heptyl-1,2,4-triazole | 0.15 g |
| 2-methyl-2-amino-1-propanol | 10 g |
| Water to make 1 l | |
| [Stop solution] | |
| Water | 2 l |
| Citric acid | 10 g |
| Sodium citrate | 35 g |

Deletion fluids were prepared by using the compounds as shown in Table 2 as deleting agents in such amounts as also shown in Table 2 to which were added 80 mmol of sodium hdyroxide and water to obtain totally 100 ml of fluids to which was further added 10 g of fine particle silica (average particle diameter 7 μm). Image portions to be deleted of said offset printing plates were wiped with an absorbent cotton impregnated with each of said deleting agents.

TABLE 2

| Deletion fluid | Deleting agent | Amount (mmol/100 ml) |
| --- | --- | --- |
| No. 1 | Compound (2) | 40 |
| No. 2 | Comparative Compound (a) | 40 |
| No. 3 | Comparative Compound (b) | 40 |
| No. 4 | Compound (3) | 40 |
| No. 5 | Compound (4) | 40 |

Thus obtained printing plates were mounted on an offset printing machine and surface of the printing plates was wiped with the same liquid for making silver image oleophilic as used in Example 1. Then, printing was carried out using offset Black ink AB-Dick 3-1012 (trade name). Temperature of printing room was 22° C. and humidity was 60%. After printing at least 5000 copies, deleting effect was examined to find that stains occurred and extended at circumferences and desired image was also deleted after printing of 2,000 to 3,000 copies in the case of using Comparative Compounds (a) and (b) while there occurred no such problems and there were obtained good results when Compounds (2), (3) and (4) of this invention were used.

EXAMPLE 3

Examples 2 was repeated except that a combination of Compound (2) (20 mmol) and Compound (8) (20 mmol) was used as the deleting agent in the deletion fluid. Same good results were obtained as when Compounds (2), (3) and (4) were used.

EXAMPLE 4

In the same method as in Example 1 except that the Compound (2) was replaced with Compound (8) dithiocyanuric acid, printing test was carried out using the same printing plates as obtained in Example 1. No ink stains occurred at the deleted portions even after printing of more than 5,000 copies and furthermore, the deletion fluid was odorless.

EXAMPLE 5

Lithographic printing plate materials were produced in the same method as in Example 1 of U.S. Pat. No. 4,160,670 except that 1.0 g/m² of hydroquinone was contained in the physical development nuclei layer of the offset printing plate (plate No. 3).

The resultant lithographic printing plate materials were imagewise exposed, then transfer developed by dipping them in a transfer developing solution of the following composition at 30° C. for 30 seconds, thereafter dipped in a stop solution of the following composition for 30 seconds (25° C.), then squeezed to remove excess solution and dried under atmospheric condition to obtain printing plates.

| [Transfer developing solution] | |
| --- | --- |
| Water | 700 ml |
| Potassium hydroxide | 20 g |
| Anhydrous sodium sulfite | 60 g |
| Potassium bromide | 0.5 g |
| 2-mercaptobenzoic acid | 1 g |
| 3-mercapto-4-acetamido-5-n-heptyl-1,2,4-triazole | 0.15 g |
| 2-methyl-2-amino-1-propanol | 10 g |
| Water to make 1 l | |
| [Stop solution] | |
| Water | 2 l |
| Citric acid | 10 g |
| Sodium citrate | 35 g |

Thus obtained printing plates were mounted on an offset printing machine AB-Dick 350 CD (Tradename) and surface of the printing plates was wiped with a solution of the composition (E) and then printing was carried out. Temperature of the printing room was 22° C. and humidity was 60%.

| [E] | |
| --- | --- |
| Water | 400 ml |
| Citric acid | 1 g |
| Sodium citrate | 3.5 g |
| 2-mercapto-5-heptyl-1,3,5-oxadiazole | 0.5 g |
| Ethylene glycol | 50 ml |

After printing of 100 copies, the printing machine was stopped and images to be deleted were deleted by the following deletion fluid.

| | |
| --- | --- |
| Compound (8) of this invention | 6.4 g (40 mmol) |
| Sodium hydroxide | 3.2 g (80 mmol) |
| Sodium alginate | 2 g |
| Polyethylene glycol (average molecular weight 6,000) | 1 g |
| Fine particle silica (average particle diameter 7 μm) | 10 g |
| Water | 100 ml |

Thereafter, printing was restarted to obtain more than 5,000 printed copies of good quality with no ink stain at the deleted portion.

The same results were obtained also when said deletion fluid was applied at the start of the printing.

EXAMPLE 6

Example 1 was repeated except that compounds (7) and (9) were used to obtain the same results as in Example 1.

EXAMPLE 7

Example 2 was repeated except that compounds (7) and (9) were used to obtain the same results as in Example 2.

What is claimed is:

1. A method for deleting images formed on offset printing plates which comprises treating the surface of undesired portion of the images formed by exposure and development with a deletion fluid which contains an S-triazine compound represented by the following general formula:

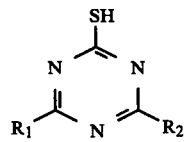

wherein $R_1$ and $R_2$ represent —SH or —OH and when either one of $R_1$ or $R_2$ is —SH, the other may be NHR wherein R is H or —R'—COOH wherein R' is an alkylene group or arylene group.

2. A method for deletion according to claim 1 wherein the S-triazine compound is represented by the following general formula (I):

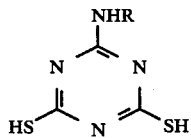

(I)

wherein R represents H or —R'—COOH wherein R' represents an alkylene group or an arylene group.

3. A method for deletion according to claim 1 wherein the S-triazine compound is represented by the following general formula (II):

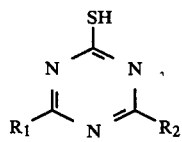

(II)

wherein $R_1$ and $R_2$ represent —SH or —OH.

4. A method for deleting images formed on offset printing plates which comprises treating the surface of undesired portion of the images formed by exposure and development with a deletion fluid which contains an S-triazine compound represented by the following general formula (I) and an S-triazine compound represented by the following general formula (II) in combination:

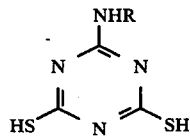

(I)

wherein R represents H or —R'—COOH wherein R' represents an alkylene group or an arylene group

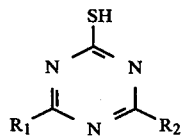

(II)

wherein $R_1$ and $R_2$ represent —SH or —OH.

5. A method for deletion according to claim 1, 2, 3 or 4 wherein the concentration of S-triazine compound in the solution is 0.1 to 20% by weight.

6. A method for deletion according to claim 1 wherein the printing plate to be treated is a printing plate made by forming silver images thereon by silver complex diffusion transfer process.

7. A method for deletion according to claim 1, wherein the S-triazine compound is

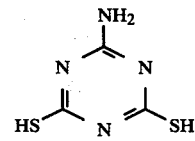

(1)

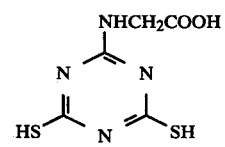

(2)

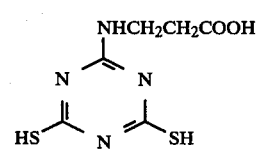

(3)

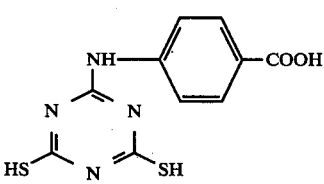

(4)

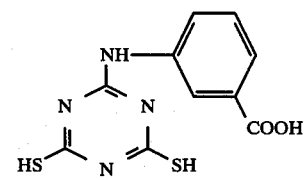

(5)

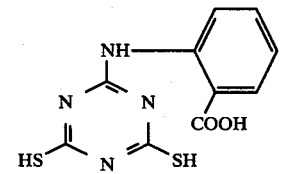

(6)

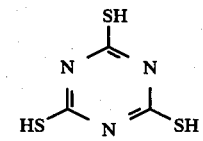

(7)

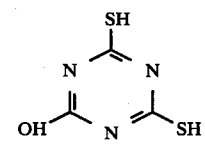

(8)

or

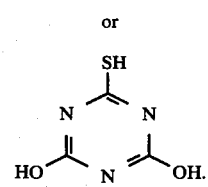

(9)

* * * * *